United States Patent
Lee

(10) Patent No.: US 7,714,379 B2
(45) Date of Patent: May 11, 2010

(54) SONOS FLOATING TRAP MEMORY DEVICE FORMED IN RECESS WITH THE LOWER SURFACE OF THE CONDUCTIVE GATE FORMED HIGHER THAT THE UPPER SURFACE OF THE ACTIVE REGION

(75) Inventor: Chang-Hyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 11/296,479

(22) Filed: Dec. 8, 2005

(65) Prior Publication Data

US 2006/0202263 A1 Sep. 14, 2006

(30) Foreign Application Priority Data

Mar. 14, 2005 (KR) .................. 10-2005-0021070

(51) Int. Cl.
*H01L 29/792* (2006.01)
(52) U.S. Cl. .............................. 257/324; 257/E29.309; 257/E21.679
(58) Field of Classification Search .................. 257/324, 257/E29.309, E21.679
See application file for complete search history.

(56) References Cited

U.S. PATENT DOCUMENTS

| | | | | |
|---|---|---|---|---|
| 5,567,635 | A * | 10/1996 | Acovic et al. ................ | 438/259 |
| 5,753,951 | A * | 5/1998 | Geissler ....................... | 257/316 |
| 6,159,801 | A | 12/2000 | Hsieh et al. | |
| 6,313,009 | B1 * | 11/2001 | Shin ............................. | 438/433 |
| 6,440,797 | B1 * | 8/2002 | Wu et al. ..................... | 438/261 |
| 6,576,949 | B1 | 6/2003 | Park | |
| 6,898,121 | B2 * | 5/2005 | Chien et al. ............. | 365/185.17 |
| 2002/0024081 | A1 * | 2/2002 | Gratz ........................ | 438/259 |
| 2002/0119666 | A1 * | 8/2002 | Kim et al. ................... | 438/704 |
| 2003/0141535 | A1 | 7/2003 | Jang | |
| 2004/0009645 | A1 | 1/2004 | Yoo | |
| 2004/0207002 | A1 | 10/2004 | Ryu et al. | |

(Continued)

FOREIGN PATENT DOCUMENTS

JP 2003-218242 7/2003

(Continued)

OTHER PUBLICATIONS

Korean Office Action (with English translation) dated Apr. 27, 2006.

(Continued)

*Primary Examiner*—Davienne Mondeau
*Assistant Examiner*—Christopher M Roland
(74) *Attorney, Agent, or Firm*—Harness, Dickey & Pierce, P.L.C.

(57) ABSTRACT

In an example embodiment, a semiconductor substrate has a plurality of active regions separated by a plurality of trenches. A gate insulation film fills at least a portion of the trenches, and a conductive gate film is formed over the gate insulation film. In an example embodiment, the gate insulation film, may include a tunneling insulation film, a charge storage film, and a blocking insulation film. The example embodiment may also include field isolation films, which partially fill the trenches of the semiconductor substrate, such that the upper surfaces of the active regions or the substrate are higher than the upper surfaces of the field isolation films.

14 Claims, 6 Drawing Sheets

U.S. PATENT DOCUMENTS

2005/0051834 A1* 3/2005 Kitamura et al. ............ 257/315
2008/0061361 A1* 3/2008 Lee et al. .................... 257/324
2009/0159959 A1* 6/2009 Park et al. ................... 257/324

FOREIGN PATENT DOCUMENTS

| | | |
|---|---|---|
| JP | 2004-048004 | 2/2004 |
| JP | 2004-221584 | 8/2004 |
| KR | 1020040005331 A | 1/2004 |
| KR | 1020040064053 A | 7/2004 |

OTHER PUBLICATIONS

Translation of German Office Action dated Apr. 27, 2007.

* cited by examiner

SONOS FLOATING TRAP MEMORY DEVICE FORMED IN RECESS WITH THE LOWER SURFACE OF THE CONDUCTIVE GATE FORMED HIGHER THAT THE UPPER SURFACE OF THE ACTIVE REGION

CROSS-REFERENCE TO RELATED APPLICATIONS

This U.S. non-provisional patent application claims priority under 35 U.S.C. §119 of Korean Patent Application 2005-21070 filed on Mar. 14, 2005, the entire contents of which are hereby incorporated by reference.

BACKGROUND

The present invention relates to semiconductor devices, and more particularly to a nonvolatile semiconductor memory device and method of fabricating the same.

Semiconductor memory devices are widely employed to store various data in electronic systems, normally classified into volatiles and nonvolatiles. Volatile memory devices lose their data when their power supply is interrupted or suspended, while the nonvolatile memory devices retain their data without power. Therefore, nonvolatile memory devices are widely used in applications such as mobile telephones, memory cards, storing audio or image files, and other portable devices in operational environments without a wired power supply.

Nonvolatile memory devices are differentiated into floating-gate types and floating-trap types. In a floating-gate memory device, a floating gate is disposed between a semiconductor substrate and a control gate, where the floating gate and substrate are separated by a tunneling insulation film. A data bit is programmed by storing an electric charge in the floating gate. The floating-trap memory device programs a data bit by storing charges in a trap, formed within a nonconductive charge storage film between a semiconductor substrate and a gate electrode.

A floating-gate memory device may lose charge due to defects in the tunneling insulation film isolating the floating gate from the semiconductor substrate. In order to remain reliable, a floating-gate memory device needs a relatively thick tunneling insulation film. A floating-trap memory device can utilize a thinner tunneling insulation film, because floating-trap memory devices have relatively low power requirements compared to the floating-gate memory devices. The relatively low power requirement, because the charges in the floating-trap memory devices are held in a trap of deep potential level.

A typical floating-trap memory structure, called a silicon-oxide-nitride-oxide-semiconductor (SONOS) cell structure, includes a channel region formed of a silicon substrate, a tunneling layer formed of a first oxide film, a charged storage film formed of a nitride film, a blocking layer formed of a second oxide film, and a control gate electrode formed of a conductive film. The charge storage film may be made of silicon nitride film or high-dielectric material film. Alternatively, the charge storage film may be formed of isolated and distributed spots such as silicon-germanium (SiGe) quantum dots, silicon quantum dots, and metallic quantum dots.

FIG. 1 is a sectional diagram of a conventional SONOS memory device, taken along the direction of bitline.

Referring to FIG. 1, the SONOS memory device has a gate stack 2 formed on a semiconductor substrate 1. The gate stack 2 includes a tunneling insulation film 3, a charge storage film 4, a blocking insulation film 5, and a conductive gate film 6 deposited in sequential layers. At both sides of the gate stack 2, source and drain regions, 7 and 8, are formed by N-type impurities.

The charge storage film 4 has a trap potential level and the SONOS memory device uses this trap potential level in operation, as follows.

Materials forming the semiconductor substrate 1, the tunneling insulation film 3, the charge storage film 4, the blocking insulation film 5, and the conductive gate film 6 are configured with different potential barriers on their surfaces. When a positive voltage is applied to the gate electrode 2 and the drain region 8 while the source region 7 is grounded, an electric field is generated along the channel leading from the source region 7 to the drain region 8. The electric field accelerates electrons from the source region 7 toward the drain region 8. A portion of the accelerated electrons overcome the potential barrier and tunnel through the tunneling insulation film 3, and are caught at the trap potential level of the charge storage film 4. As electrons are caught and accumulated at the charge storage film 4, a threshold voltage of the cell transistor increases to set the cell transistor in a programmed state (or an erased state). When a negative voltage is applied to the gate stack 3, the electrons trapped in the charge storage film 4, tunnel through the insulation film 3 and move into the semiconductor substrate 1. At the same time, holes pass through the tunneling insulation film 3 from the semiconductor substrate 1 and are caught in the charge storage film 4, resulting in a decrease of the threshold voltage which sets the cell transistor to the erased state (or the programmed state).

FIG. 2 is a sectional diagram of a conventional SONOS memory device, taken along the direction of the gate length. In FIG. 2, field isolation films 9 are formed in the semiconductor substrate 1, confining active regions therein. The field isolation films 9, the tunneling insulation film 3, the charge storage film 4, and the blocking insulation film 5, and the conductive gate film 6 are deposited in sequence on the semiconductor substrate.

As the technological trend to increase the density and reduce the size of semiconductor memory devices continues, structural design at the microscopic level, which had not posed a problem before, is becoming an increasingly critical factor in operational performance of semiconductor memory devices, such as SONOS memory devices.

FIGS. 3A and 3B illustrates problems arising from the conventional art, particularly, the problems associated with the boundary between the active regions and the field isolation films. FIG. 3A illustrates a section of a conventional SONOS memory device along the gate direction, while FIG. 3B illustrates an enlarged view of the dotted circle in FIG. 3A.

From FIG. 3A, it is evident that there are microscopic step differences between the top surface of the field isolation films 9 and the top surface of the semiconductor substrate 1 at the active region. The field isolation films 9 are generally formed, after forming a pad insulation pattern on the semiconductor substrate 1 and then forming trenches on the semiconductor substrate 1 using the pad insulation pattern as an etch mask, and filling the trenches with an insulation material. A planarization process is then carried out until the top surface of the semiconductor substrate 1 is exposed, and the pad insulation pattern is completely removed. This process inevitably causes microscopic step differences, such that the top surfaces of the field isolation films 9 are positioned minutely higher than the top surface of the active regions of the semiconductor substrate 1. As a result, as the tunneling insulation film 3, the charge storage film 4, the blocking insulation film 5, and the conductive gate film 6 are sequentially deposited in the structure having the step differences, the films 3 through 6 cannot settle in flattened profiles. As illustrated in FIG. 3A, the tunneling insulation film 3 as an example is concavely deposited on the semiconductor substrate 1 between the field isolation films 9. Previously, the step difference between the top surfaces of the field isolation films 9 and the semiconductor substrate 1 of the active regions have not been considered an important factor. However, as semiconductor devices continue to shrink in size the step difference is becoming an important factor to the operational performance of semiconductor devices.

FIG. 3B, further illustrates how the thickness of the tunneling insulation film 3 varies over the active region as a result of the step difference. When voltages are applied to the structure for programming and erasing data, an electric field varies between the center and edges of the active regions. While the electric field is uniformly formed at the center of the active region, it becomes irregular and weak near the edges of the active region where the tunneling film is thicker. The programming and erasing operations are carried out using tunneling charges accelerated by the electric field. However, the intensity of the electric field differs along the tunneling insulation film, which causes the speeds of the programming and erasing operations to be differs in the center and edges of the active region. This problem may become more serious as the memory cell sizes become smaller and the edges of the active region occupy a high percentage of the area of the cell structure.

SUMMARY OF THE INVENTION

The present invention is directed to a nonvolatile memory device and method of fabricating the same.

In an example embodiment, a semiconductor substrate has a plurality of active regions separated by a plurality of trenches. A gate insulation film fills at least a portion of the trenches, and a conductive gate film is formed over the gate insulation film.

In an example embodiment, the gate insulation film, may include a tunneling insulation film, a charge storage film, and a blocking insulation film. The example embodiment may also include field isolation films, which partially fill the trenches of the semiconductor substrate, such that the upper surfaces of the active regions or the substrate are higher than the upper surfaces of the field isolation films. Furthermore, the gate insulation film may be formed such that at least a portion of the gate insulation film fills remaining portions of the trenches unfilled by the field isolation films. The remaining portions of the trenches may be filled with the tunneling insulation film and the charge insulation film.

In another example embodiment, the trenches are filled exclusively with the gate insulation film.

In another example embodiment, a metal film may be formed between the gate insulation film and the conductive gate film. The metal film only fill at least a portion of the trenches.

BRIEF DESCRIPTION OF THE DRAWINGS

The accompanying drawings are included to provide a further understanding of the invention. The drawings illustrate example embodiments of the present invention and, together with the description, serve to explain principles of the present invention. The drawing should not be interpreted to limit the scope of the present invention. The accompanying drawings are not to be considered as drawn to scale unless explicitly noted. In the drawings.

DETAILED DESCRIPTION OF EXAMPLE EMBODIMENTS

Example embodiments of the present invention will be described below in more detail with reference to the accompanying drawings. The present invention may, however, be embodied in different forms and should not be limited to the embodiments set forth herein. Rather, these embodiments are provided so that this disclosure will thoroughly and completely convey the scope of the invention to those skilled in the art.

The thickness of layers and regions in the figures are exaggerated for clarity. When a layer is referred to as being on another layer or substrate, it may be directly on the other layer or substrate, or may contain intervening layers. Like numerals refer to like elements throughout the specification.

FIGS. 4A through 4D are sectional diagrams of nonvolatile semiconductor memories, taken along the direction of gate length, in accordance with various embodiments of the invention.

Figure 1:
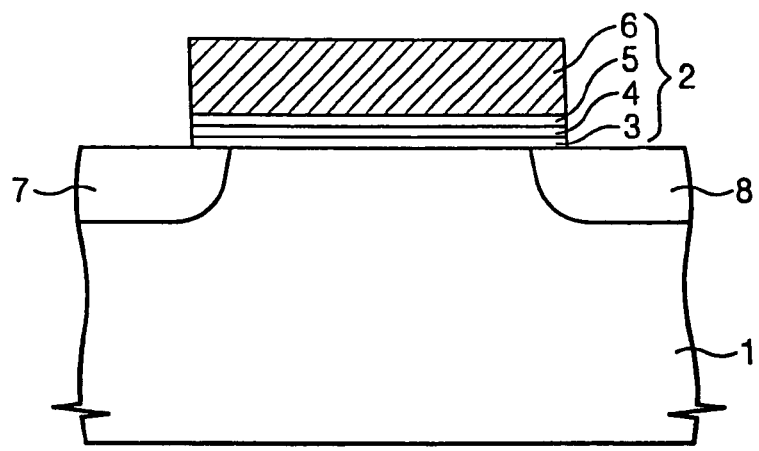
FIG. 1 is a sectional diagram of a conventional SONOS memory device, taken along the direction of the bitline.
Figure 2:
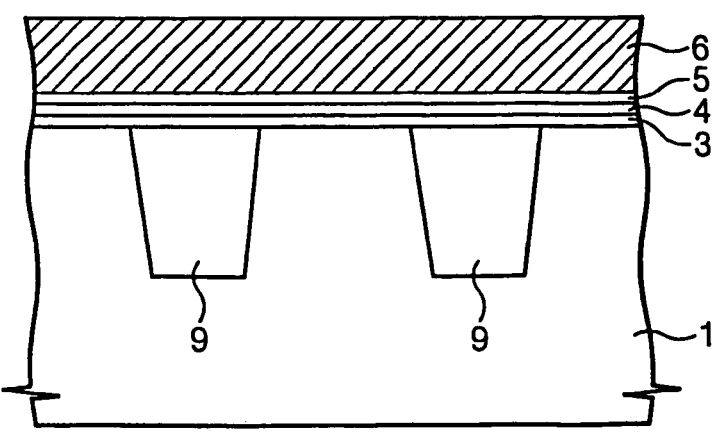
FIG. 2 is a sectional diagram of a conventional SONOS memory device, taken along the direction of the gate length.
Figure 3A:
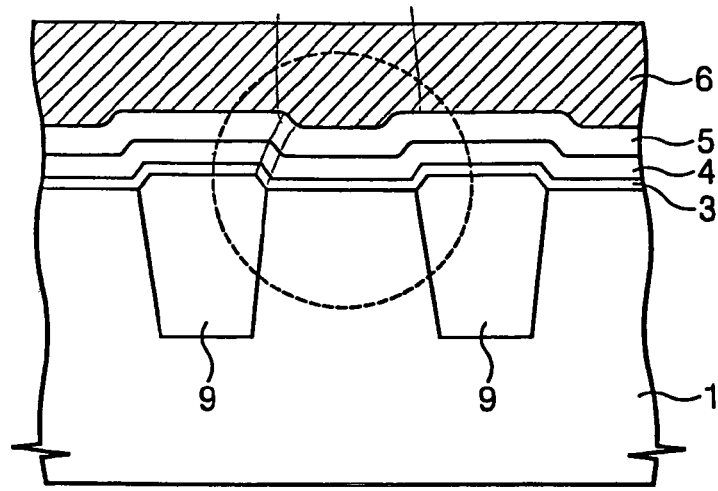
FIGS. 3A and 3B illustrates problems arising from the conventional art.
Figure 3B:
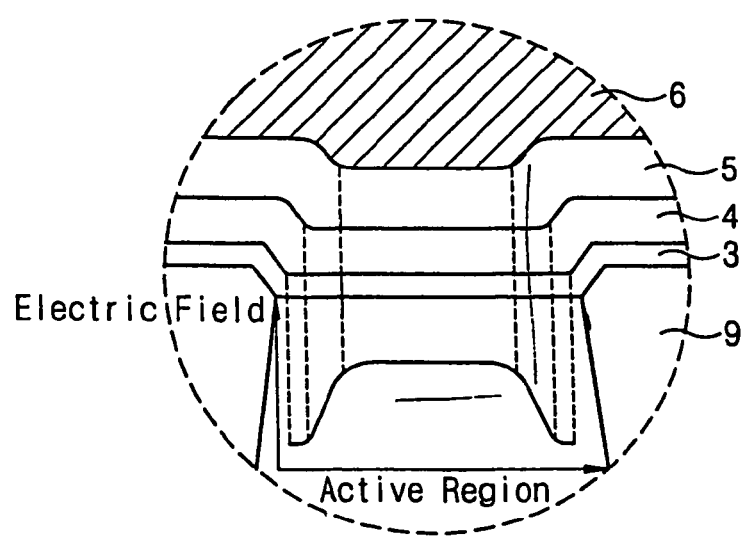
Figure 4A:
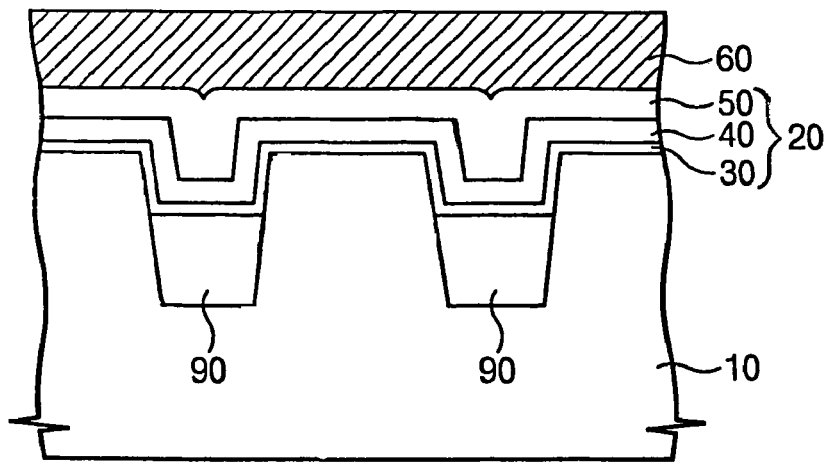
FIGS. 4A through 4D are cross-sectional diagrams of nonvolatile semiconductor memories, taken along the direction of the gate length, in accordance with various embodiments of the invention.

In FIG. 4A, field isolation films 90 are formed in the semiconductor substrate 10, confining active regions there between. A gate insulation film 20 and a conductive gate film 60 are then deposited on the surface of the active regions and the field isolation films 90. The gate insulation film 20 includes a tunneling insulation film 30, a charge storage film 40, and a blocking insulation film 50. As illustrated in FIG. 4A, the top surfaces of the field isolation films 90 are recessed below the top surface of the semiconductor substrate 10, creating cavities between the active regions of the semiconductor substrate 10. The active regions of the semiconductor substrate 10 protrude upward between the field isolation films 90 In this embodiment, the gate insulation film 20 is formed on inner sides of the concavely recessed semiconductor substrate 10 and over field isolation films 90. Thereby, assuring that the gate insulation film 20 is formed of a uniform thickness at least on the active regions of the semiconductor substrate 10.

The recessed thickness of the field isolation film 90 may be in the range of 5~20% of the initial thickness of the field isolation films 90 that had been formed to separate the active regions. In other words, the remaining portions of the trenches unfilled by the field isolation films is 5~20% of the depth of the trenches. As the field isolation films 90 are recessed deeper, the stepped portions of the gate insulation film 20 shift into the inner sides of the cavity in the semiconductor substrate 10. However, the physical and electrical isolation effect is reduced as the recessed thickness of the field isolation films 90 increases. The recessed thickness of field isolation films 90 may be controlled to be within a desired range. For example, when the field isolation films 90 are formed at a thickness of about 4000 Å in the SONOS memory device, the recessed thickness of the gate insulation film may be 300~400 Å. The depth of the recessed portion of the field isolation films 90 may be variable relative to the depth of the trenches for the field isolation films 90, so long as the field isolation films 90 are of a sufficient thickness to allow the gate insulation firm to be formed of a uniform thickness on the active regions of the substrate.

Figure 4B:
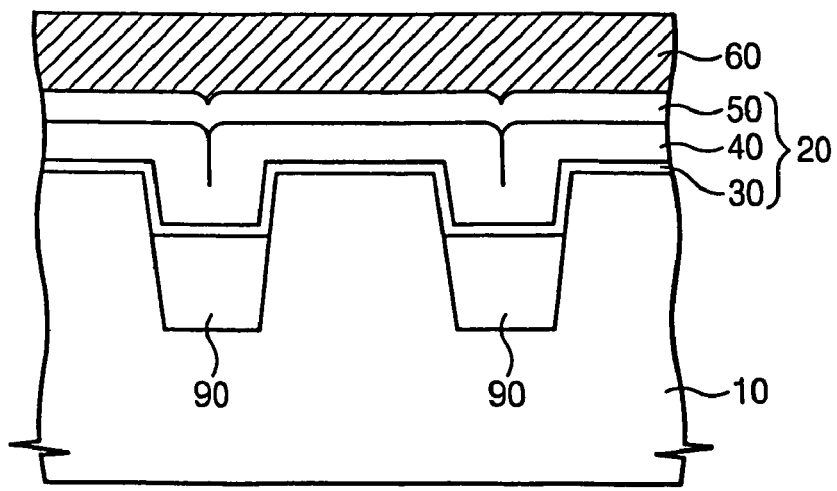

FIG. 4B illustrates sectional structure of another embodiment of the invention. In FIG. 4B, the field isolation films 90 are formed in the semiconductor substrate 10 to confine the active regions. The gate insulation film 20 is disposed over the top surfaces of the field isolation films 90 and the active regions of the semiconductor substrate 10. The gate insulation film 20 includes the tunneling insulation film 30, the charge storage film 40, and the blocking insulation film 50. The conductive gate film 60 is deposited over the gate insulation film 20. The top surfaces of the field isolation films 90 are recessed below the top surfaces of the active regions of the semiconductor substrate 10. The embodiment illustrated in FIG. 4B differs from that in FIG. 4A, in that the recessed portions of the field isolation films 90 are filled only with the tunneling insulation film 30 and the charge storage film 40, while the blocking insulation film 50 does not intruded into the recessed portions. This pattern does not cause a remarkable variation in operation of the memory device, but differs from the former embodiment in that the charge storage film 40 is formed thicker.

Figure 4C:
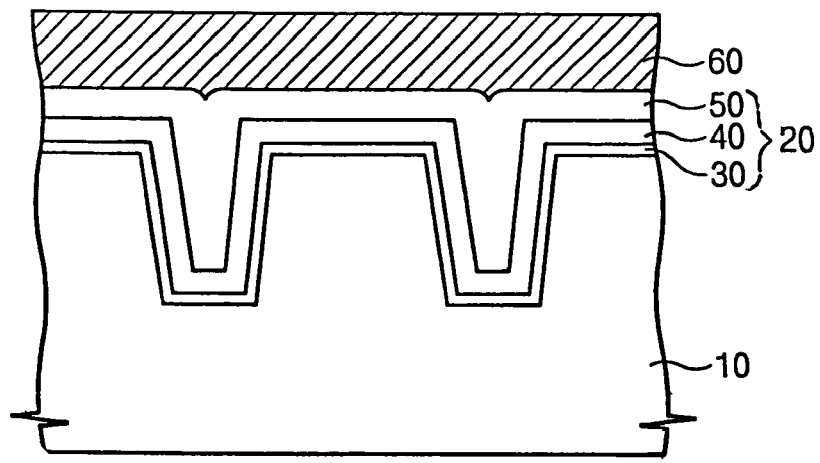

FIG. 4C illustrates another embodiment of the invention. In FIG. 4C, while trenches are formed in the semiconductor substrate 10 to confine the active regions, there is no field isolation film. Instead, the gate insulation film 20 functions as the field isolation film. While the former embodiment may restrict the depth of the recessed portions of the field isolation films to a certain range, the gate insulation film 20 is able to function as the field isolation film, although the field isolation film is completely removed. This functionality may be achieved because the gate insulation film 20 is substantially formed of insulation materials as described below.

The lowest layer of the gate insulation film 20 is the tunneling insulation film 30 that is formed of a thermal oxide film ($SiO_2$) generated by oxidizing the silicon semiconductor substrate. Since the field isolation films may be formed of oxide films with high density plasma (HDP) oxide film, the tunneling film 30 is identical to the field isolation films. The charge storage film 40, which is used with an insulation film, is generally formed of a silicon nitride film ($Si_3N_4$), which has high trap density and electron affinity higher than the tunneling insulation film 30 or the blocking insulation film 50. The charge storage film 40 may also be a silicon oxy-nitride (SiON) film, a film containing silicon dots, a film containing nitride dots, or a ferroelectric layer. The blocking insulation film 50, as the highest layer of the gate insulation film 20, may be a silicon oxide film may be formed of a high dielectric (or high-k) film having a high dielectric constant and a large band-gap, or a metal oxide film. The blocking insulation film 50 may also be formed of an aluminum oxide ($Al_2O_3$) film, a tantalum pentaoxide ($Ta_2O_5$) film, a titanium dioxide ($TiO_2$) film, a hafnium alumina (HfAlO, HfAlON) film, or a hafnium silicon oxide (HfSiO, HfSiON) film, or a composite film including a combination of the above high-dielectric materials.

Since the three layers constituting the gate insulation film 20 may be formed of insulation materials, the gate insulation film 20 is able to substitute for the plurality of field isolation films in the previous embodiments. Thus, it is possible to effectively create the field isolation structure even without additional field isolation films within the semiconductor substrate, wherein the whole field isolation structure is the result of the recessed pattern within the substrate and the gate insulation film 20, as shown in FIG. 4C.

Figure 4D:
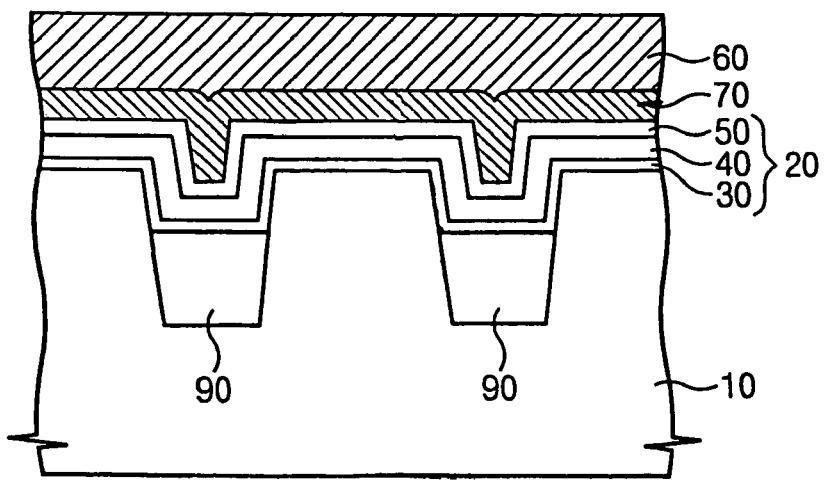

FIG. 4D illustrates still another embodiment of the invention. Referring to FIG. 4D, the field isolation films 90 are formed in the semiconductor substrate 10 between the active regions. The gate insulation film 20 is formed on the surfaces of the field isolation films 90 and the active regions of the semiconductor substrate 10. The gate insulation film 20, a metal film 70, and the conductive gate film 60 deposited in sequence. Besides having the top surfaces of the field isolation films 90 recessed below the top level of the active regions on the semiconductor substrate 10, a metal film 70 is deposited on the overall structure. The metal film 70 partially fills up the recessed portions over the field isolation films 90. The metal film 70 may be applied to the structures shown in FIG. 4A, 4B or 4C. For instance, if the metal film 70 is applied to the structure of FIG. 4B, the recessed regions of the field isolation films 90 are filled up just with the tunneling insulation film 30 and the charge storage film 40, and the metal film 70 is formed over the blocking insulation film 50. The metal film 70 may have a work function larger than that of a conductive gate film 60 using an N-type polysilicon. In detail, the metal film 70 may be a titanium nitride (TiN) film, a titanium silicon nitride (TiSiN) film, a tantalum nitride (TaN) film, a tungsten nitride (WN) film, a hafnium nitride (HfN) film, a tantalum silicon nitride (TaSiN) film, a titanium (Ti) film, a tungsten (W) film, an iridium (Ir, IrO) film, or a platinum (Pt) film, any of which may have a work function over 4 eV. Or the metal film 70 may be a composite film including a combination of the above films, which may have a work function over 4 eV.

The metal film 70 and conductive gate film 60 form a gate electrode, and contribute to shortening operation times in an erasing mode. As mentioned before, electrons held at the trap in the charge storage film 40 are discharged into the semiconductor substrate 10 through the tunneling insulation film 30 during an erasing operation. During this operation, electrons from the conductive gate film 60 may tunnel through the blocking insulation film 50 and be injected into the charge storage film 40. The electrons injected into the charge storage film 40 may cause a delay in the erasing time. However, the addition of metal film 70 generates a high potential barrier between the conductive gate film 60 and the blocking insulation film 50, such that the probability of electrons tunneling through the blocking insulation film 50 is reduced, thus shortening the time of the erasing operation (i.e., an erasing time). As illustrated in FIG. 4D, while it is possible to form the gate electrode by depositing the metal film 70 and the conductive polysilicon film 60 in sequence, it is also possible to form the gate electrode only with the metal film 70 having the work function higher than that of an N-type polysilicon.

Next, a method of fabricating the semiconductor memory device shown in FIGS. 4A through 4D will be described. FIG. 5A through 5E provide an example method of fabricating the structure shown in FIG. 4A. It will be understood that the other structures shown in FIGS. 4B through 4D may be completed by fabrication methods similar thereto.

Figure 5A:
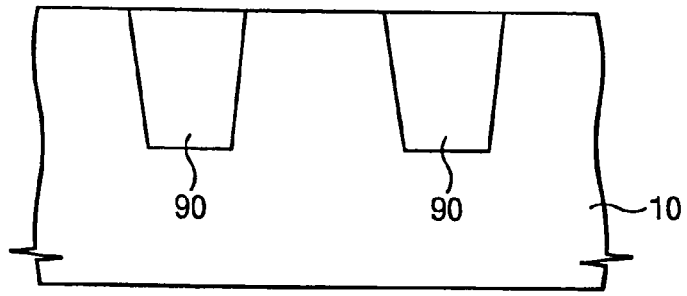
FIGS. 5A through 5E are sectional diagrams illustrating processing steps for fabricating the nonvolatile semiconductor memory device in accordance with an embodiment of the invention.

Referring to FIG. 5A, the field isolation films 90 are formed in the semiconductor substrate 10, isolating the active regions therein. The field isolation films 90 may be formed by the process of shallow trench isolation (STI). For example, a pad insulation film may be patterned to identify the regions where the trenches will be etched in the semiconductor substrate 10. The pad insulation film may be comprised of oxide and nitride films. The trenches are then formed by selectively etching the semiconductor substrate 10 using the patterned pad insulation film as an etch mask. After protecting the inner walls of the trenches by depositing a silicon oxide film (not shown) over the resultant structure including the trenches, the trenches are filled with undoped silicate glass (USG) films or high-density plasma (HDP) oxide films, having high gap-filling capability. Thereafter, by flattening the oxide films in the trenches and removing the pad insulation pattern, the field isolation films 90 are completed and serve to divide the substrate into active and inactive regions.

Figure 5B:
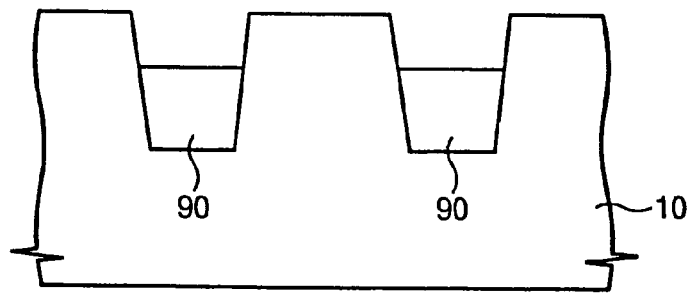

Referring to FIG. 5B, the field isolation films 90 are recessed by removing portions of the field isolation films 90 from the upper surfaces thereof. The thickness of the removed recessed portion may be within the range of 5~20% of the original thickness of the field isolation films 90. For instance, provided that the field isolation films 90 are formed having a thickness of 4000 Å, the recessed thickness may be 300~400 Å. The field isolation films 90 may be recessed by either a dry or a wet etch process. For example, in the case of employing a wet etch process for the recession of the field isolation film 90, an etch-back process is carried out with a buffered oxide etchant (BOE) using hydro-fluoride (HF) or a hydro-fluoride solution diluted with water. During this process, the semiconductor substrate 10 is dipped in an etchant or an etchant is showered on the semiconductor substrate 10. In other words, the final remaining portions of the trenches unfilled by the field isolation film is 5%-20% of the original depth of the trenches.

As a result of the etching process, the top surfaces of the active regions, protrude above the top surfaces of the field isolation films 90. An alternative method to get the top surface of the semiconductor substrate 10 to protrude above the top surface of the field isolation surface 90 is to elevate the surface level of the semiconductor substrate by selective epitaxial growth. In addition, as with the embodiment shown in FIG. 4C, when the field isolation films 90 are substituted with the gate insulation film 20, there is no need to go through the step of forming the field isolation films 90. Therefore, while it is possible to recess the surfaces of the field isolation films 90 after forming the field isolation films 90, it is also possible to directly deposit the gate insulation film 20 and the conductive gate film 60 (refer to FIGS. 5C and 5D) without the formation and recession of the field isolation films 90 after forming the trenches confining the active regions in the semiconductor substrate 10.

Figure 5C:
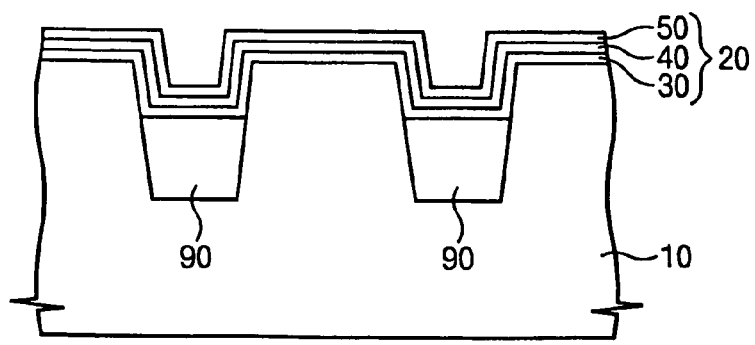

Referring to FIG. 5C, the gate insulation film 20, which includes the tunneling insulation film 30, the charge storage film 40 and the blocking insulation film 50, is formed on the recessed structure. The tunneling insulation film 30 may be formed by conducting thermal oxidation or low-pressure chemical vapor deposition (LPCVD) over the structure of FIG. 5B. The charge storage film 40 is then formed by conducting LPCVD. Finally, the blocking insulation film 50 is deposited on the charge storage film 40.

Figure 5D:
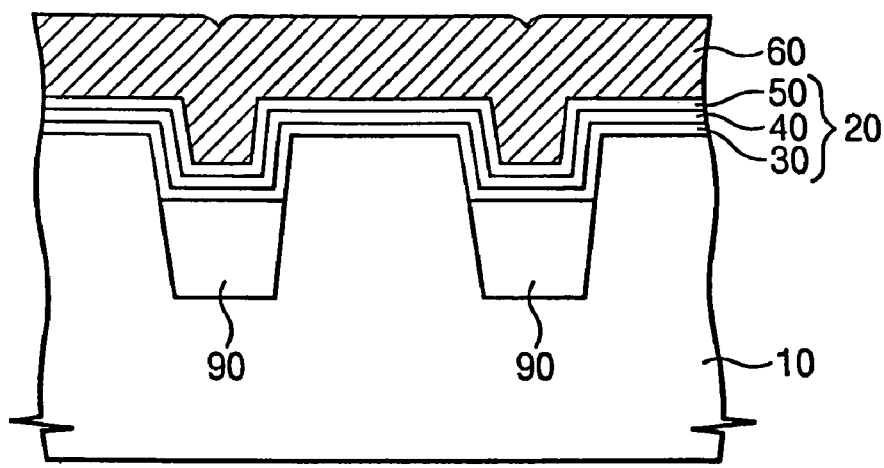

Referring to FIG. 5D, the conductive gate film 60 is formed on the resultant structure, including the gate insulation film 20. The metal film 70, discussed with respect to FIG. 4D, may be further deposited prior to the conductive gate film 60. The conductive gate film 60 may be formed of a doped polysilicon or a doped polysilicon and metal silicide. The polysilicon conductive gate film 60 may be formed by a chemical vapor deposition (CVD). In order to make the polysilicon conductive, the polysilicon is doped with impurities during or after deposition.

Figure 5E:
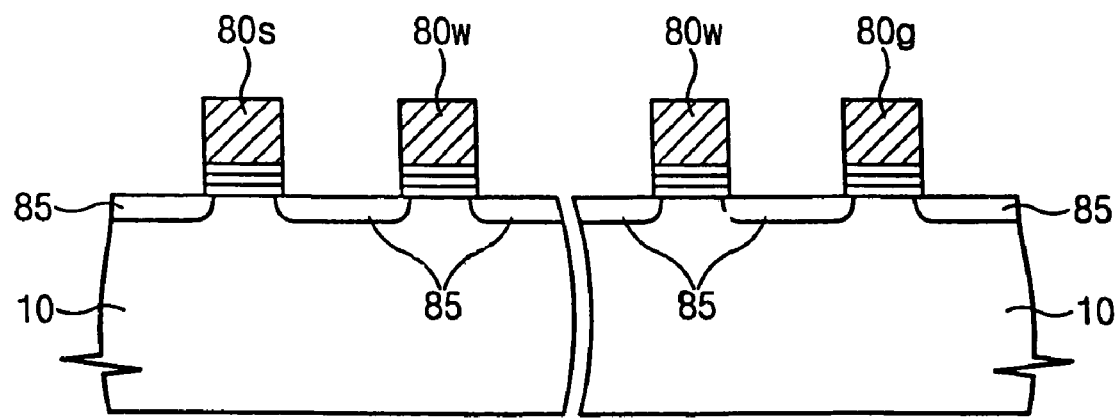

Finally, referring to FIG. 5E, other general processing steps may be carried out to pattern the gate insulation film 20 and the conductive gate film 60 and to implant ions into the active regions. In the drawings illustrating the method of fabricating the nonvolatile semiconductor memory device, FIGS. 5A through 5D are taken along the direction of a gate length, but FIG. 5E is taken along with the direction of a bitline. As shown in FIG. 5E, the electrodes 80s, 80w, and 80g are formed by layering the conductive gate film and the gate insulation film in sequence. Electrode 80s is a string selection line, electrode 80g is a ground selection line, and electrodes 80w are wordlines. Ionic impurities are injected into the active regions to form impurity regions 85 of the semiconductor substrate 10. During the injection process, using the electrodes 80s, 80w, and 80g act as an ion implantation mask. Thereafter, an interlayer insulation film is deposited over the semiconductor substrate 10. Subsequent processing steps form the contact leads to the impurity regions 85, to which the bitlines are connected.

Although the present invention has been described in connection with the embodiments of the present invention illustrated in the accompanying drawings, the present invention is not limited to the disclosed embodiments. It will be apparent to those skilled in the art that it is possible to make various substitutions, modifications and changes without departing from the scope and spirit of the invention.

The invention claimed is:

1. A semiconductor memory device comprising:
    a semiconductor substrate having a plurality of active regions separated by a plurality of trenches in said semiconductor substrate;
    a field isolation film partially filling the trenches such that the upper surface of the active regions is higher than the upper surface of the field isolation film;
    a gate insulation film including at least a tunneling insulation film, a charge storage film and a blocking insulation film, the gate insulation film formed over the field isolation film such that at least a portion of the gate insulation film completely fills remaining portions of the trenches unfilled by the field isolation film; and
    a conductive gate film formed over said gate insulation film, wherein an entirety of the lower surface of said conductive gate film is higher than the upper surface of the active regions, wherein a distance between the field isolation film and the conductive gate film over the field isolation film is greater than a distance between respective active regions and the conductive gate film over the respective active regions.

2. The semiconductor memory device in accordance with claim 1, wherein the remaining portions are filled by the tunneling insulation film, the charge storage film, and the blocking insulation film.

3. The semiconductor memory device in accordance with claim 1, wherein the remaining portions are filled by the tunneling insulation film and the charge storage film.

4. The semiconductor memory device in accordance with claim 1, wherein a depth of the remaining portions is equivalent to 5%~20% of a depth of the trench.

5. The semiconductor memory device in accordance with claim 1, wherein a depth of the remaining portions is in a range of 300-400 Angstroms.

6. The semiconductor memory device in accordance with claim 1, wherein the tunneling insulation film is formed of a thermal silicon oxide film.

7. The semiconductor memory device in accordance with claim 1, wherein the charge storage film includes at least one of a silicon nitride film, a silicon oxy-nitride film, a high-dielectric film, a film containing silicon dots, a film containing silicon-germanium dots, a film containing germanium dots, a film containing metal dots, and a film containing nitride dots.

8. The semiconductor memory device in accordance with claim 1, wherein the blocking insulation film includes at least of a silicon oxide film, a high-dielectric film, a metal oxide film, and a composite film including pluralities of the films.

9. The semiconductor memory device in accordance with claim 1, wherein the conductive gate film includes polysilicon.

10. The semiconductor memory device in accordance with claim 1, wherein the gate insulation film formed over the field isolation film exclusively fills a remaining unfilled portion of the trenches.

11. The semiconductor memory device in accordance with claim 1, further comprising:
    a metal film formed between the gate insulation film and the conductive gate film.

12. The semiconductor memory device in accordance with claim 11, wherein the metal film has a work function larger than 4.0 eV.

13. The semiconductor memory device in accordance with claim 11, wherein the metal film includes at least one of a titanium nitride (TiN) film, a titanium silicon nitride (TiSiN) film, a tantalum nitride (TaN) film, a tungsten nitride (WN) film, a hafnium nitride (HfN) film, a tantalum silicon nitride (TaSiN) film, a titanium (Ti) film, a tungsten (W) film, an iridium (Ir, IrO) film, a platinum (Pt) film.

14. The semiconductor memory device in accordance with claim 1, wherein the gate insulation film extends over the active regions and the gate insulation film directly contacts the upper surface of the active regions.

* * * * *